United States Patent
Tsai et al.

(10) Patent No.: US 12,241,157 B2
(45) Date of Patent: Mar. 4, 2025

(54) SYSTEM AND METHOD FOR CLEANING A PRE-CLEAN PROCESS CHAMBER

(71) Applicant: Taiwan Semiconductor Manufacturing Company, Ltd., Hsinchu (TW)

(72) Inventors: Yu-Ting Tsai, New Taipei (TW); Hung-Chih Wang, Hsinchu (TW); Hong-Ming Lo, Changhua County (TW); Shao-Shuo Wu, Changhua County (TW); Su-Yu Yeh, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 297 days.

(21) Appl. No.: 17/679,483

(22) Filed: Feb. 24, 2022

(65) Prior Publication Data

US 2023/0017955 A1 Jan. 19, 2023

Related U.S. Application Data

(60) Provisional application No. 63/222,648, filed on Jul. 16, 2021.

(51) Int. Cl.
| | |
|---|---|
| *C23C 16/44* | (2006.01) |
| *B08B 9/00* | (2006.01) |
| *B08B 9/032* | (2006.01) |
| *C23C 16/02* | (2006.01) |

(52) U.S. Cl.
CPC ............ *C23C 16/4405* (2013.01); *B08B 9/00* (2013.01); *B08B 9/0328* (2013.01); *C23C 16/0227* (2013.01)

(58) Field of Classification Search
CPC ... C23C 16/4405; C23C 16/0227; B08B 9/00; B08B 9/0328
See application file for complete search history.

(56) References Cited

U.S. PATENT DOCUMENTS

| | | | | |
|---|---|---|---|---|
| 5,637,190 A | * | 6/1997 | Liao ................. | H01J 37/32082 438/758 |
| 8,591,659 B1 | * | 11/2013 | Fang ................. | H01J 37/32862 134/1.1 |

* cited by examiner

*Primary Examiner* — Sharidan Carrillo
(74) *Attorney, Agent, or Firm* — Lippes Mathias LLP (57) ABSTRACT

A system and method for cleaning a preclean process chamber in between wafer processing. The internal pressure of the preclean process chamber is reduced to a first pressure and a first gas that consists of oxygen and an inert or noble gas, is introduced into the chamber. Plasma is generated within the preclean process chamber using the first gas at the first pressure. Internal pressure is then reduced to a second pressure, less than the first, and the first gas is continued into the chamber. Plasma is then generated using the first gas at the second pressure. Thereafter, a second gas, consisting of an oxygen-free inert or noble gas, is introduced into the chamber at the second pressure, following which plasma is generated within the chamber using only the second gas.

20 Claims, 10 Drawing Sheets

SYSTEM AND METHOD FOR CLEANING A PRE-CLEAN PROCESS CHAMBER

PRIORITY CLAIM AND CROSS-REFERENCE

This application claims the benefit of U.S. Provisional Application Ser. No. 63/222,648 filed Jul. 16, 2021 and titled TISIX CIP ON PRE-CLEAN AND DEGAS CHAMBER FOR INTERFACE O&F (OXYGEN AND FLUORINE) IMPROVEMENT. U.S. Provisional Application Ser. No. 63/222,648 filed Jul. 16, 2021 and titled TISIX CIP ON PRE-CLEAN AND DEGAS CHAMBER FOR INTERFACE O&F (OXYGEN AND FLUORINE) IMPROVEMENT is incorporated herein by reference in its entirety.

BACKGROUND

In semiconductor manufacturing, a precleaning process may be used to remove water molecules, hydrocarbons, and other particles or contaminants from a substrate or wafer before subsequent deposition processes. Plasma vapor deposition chambers may be used to perform precleaning operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

Physical vapor deposition (PVD) is a process for depositing a thin film of material on a substrate and is commonly used in the fabrication of semiconductor devices. The PVD process is carried out at high vacuum in a process chamber on a substrate (e.g., a wafer). The process chamber also contains a solid source or slab of material to be deposited on the substrate. The solid source or the slab of material is therefore referred to as a PVD target. In the PVD process, the PVD target is physically converted from a solid into a vapor. The vapor of the target material is transported from the PVD target to the substrate where it is condensed on the substrate as a thin film.

There are many methods for accomplishing PVD including, for example and without limitation, evaporation, e-beam evaporation, plasma spray deposition and sputtering. Presently, sputtering is the most frequently used method for accomplishing PVD. During the sputtering, plasma is created in the chamber and directed to the PVD target. The plasma physically dislodges or erodes (sputters) atoms or molecules from the reaction surface of the PVD target into a vapor of the target material, as a result of collision with high-energy particles (ions) of the plasma. The vapor of sputtered atoms or molecules of the target material is transported to the substrate through a region of reduced pressure and condenses on the substrate, forming the thin film of the target material.

The aforementioned PVD chamber may be used for pre-cleaning of a wafer substrate prior to subsequent deposition processes, as well as between different deposition processes. For example, $NH_4F$ formed in a remote plasma may be flowed into the preclean chamber through showerheads and onto the wafer surface, $NH_4F$ reacts with native oxide previously formed on the wafer substrate surface and forms $(NH_4)_2SiF_6$, which subsequently sublimates and leaves the wafer surface during an annealing process carried out in the same chamber. However, residual gases in the chamber may negatively impact the efficacy of subsequent wafer precleaning operations. For example, as dimensional shrinkage of components on a semiconductor device continues, effective cleaning with minimal critical dimension change is desired. Highly reactive oxygen and fluorine residual gases incorporating the titanium silicide (TiSix)—epitaxial semiconductor material (EPI) (i.e., TiSix-EPI) interface results in higher Rc (via resistance) and higher Rs (line resistance) and low yield. The embodiments disclosed herein reduce the amount of oxygen and fluorine on the TiSix-EPI interface, improving production (i.e. reducing defects) and increasing yield.

In some embodiments, the chamber cleaning process for a preclean chamber uses reactive oxygen of the oxygen/argon mixture (or, more generally, oxygen/inert gas mixture) which provides for cleaning of organics and other contaminants in the chamber that react with the oxygen. This is optionally aided by forming a plasma from the first gas, which breaks the molecular $O_2$ into highly reactive oxygen species. However, while these steps advantageously employ oxygen for effective chamber cleaning, it is recognized herein that the oxygen admitted to the chamber can leave residual oxygen in the chamber after completion of cleaning the subsequent chamber purge, which can then contaminate the EPI surface of a subsequently loaded wafer that is to undergo pre-cleaning. That EPI surface contamination, in turn, can lead to a degraded TiSix/EPI interface between the EPI and the subsequently deposited TiSix. As disclosed herein, this deleterious effect of the oxygen is mitigated by interposing a third chamber cleaning step between the second chamber cleaning employing the first gas containing oxygen (e.g., the illustrative oxygen/argon mixture, or more generally a mixture of oxygen and an inert gas such as a noble gas) and the final purge. Because the second gas used in the interposed third cleaning step is an inert gas or noble gas (i.e. an oxygen-free or oxygen-deficient gas), such as argon, that does not contain oxygen, it operates to remove the residual oxygen from two previous cleaning steps from the chamber.

Figure 1:
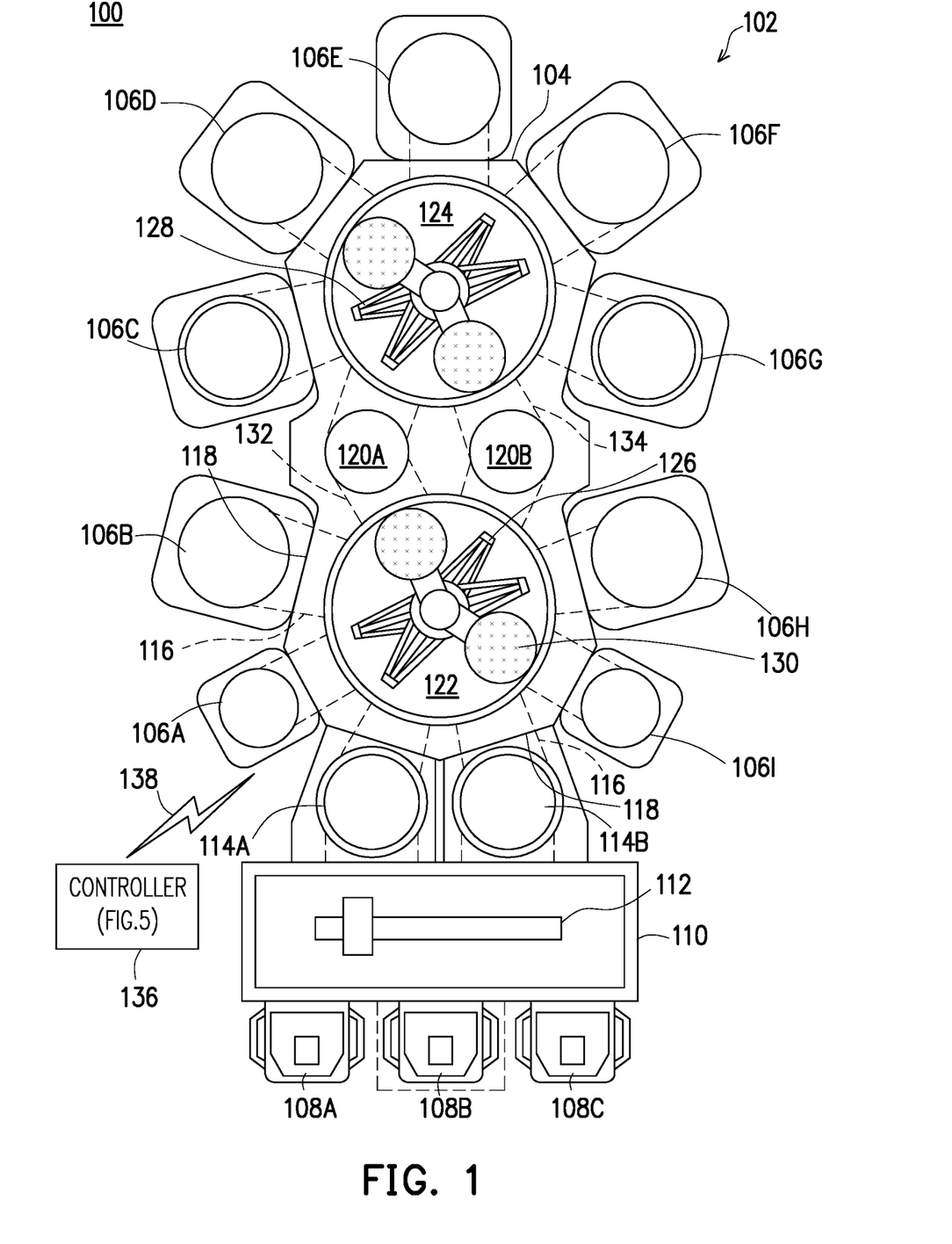
FIG. 1 is a schematic view of a multi-chamber platform in accordance with some embodiments.
Figure 2:
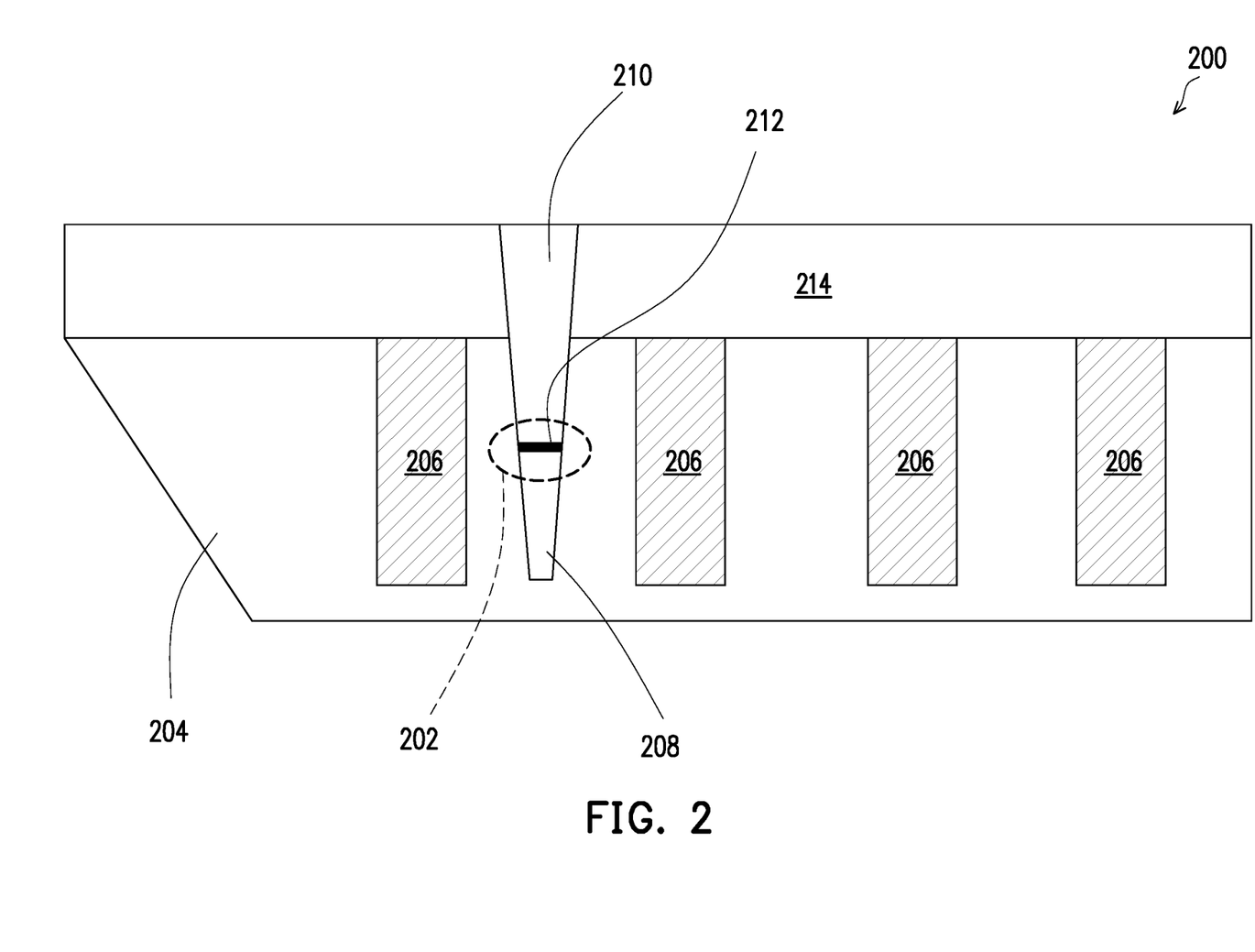
FIG. 2 is a simplified side sectional view showing a semiconductor device having an improved TiSix-EPI interface in accordance with some embodiments.

Turning now to FIG. 1, there is illustrated a system 100 for producing a semiconductor device having an improved TiSix-EPI interface (as shown in FIG. 2) in accordance with one embodiment disclosed herein. FIG. 2 provides an illustrative side sectional view of a semiconductor device 200 having an improved TiSix-EPI interface 202 produced in accordance with embodiments disclosed herein. The semiconductor device 200 depicted in FIG. 2 includes a substrate 204 in which one or more metal-to-gate (MG) 206 are formed. An inter layer dielectric (ILD) 214 is then formed upon the substrate. The TiSix-EPI interface 202 shown in FIG. 2 may, for example, represent the interface of a metal-to-drain (MD) component 210 and an epitaxial component 208 joined by a TiSix layer 212.

Returning to FIG. 1, the system 100 includes a platform 102 having a main body 104 and a plurality of processing chambers 106A, 106B, 106C, 106D, 106E, 106F, 106G, 106H, and 106I communicatively coupled to the main body 104 so that semiconductor wafers undergoing processing can be robotically transferred between the various processing chambers. It will be appreciated by those skilled in the art that the number and types of process chambers 106A-106I may vary in accordance with the manufacturing requirements of a particular fab.

As described in greater detail below, the system 100 is capable of producing layers of various materials stacked on one another on a substrate without exposing the substrate to the pressure and contaminants of ambient air until the stack is complete. Thus, the process chambers 106A-106I may include at least one metal deposition chamber and at least one dielectric layer deposition chamber for depositing layers in a stack. In other embodiments, one or more of the process chambers 106A-106I may include a sputtering target for depositing material onto the stack.

In the embodiment illustrated in FIG. 1, the main body 104 includes a first robot buffer chamber 122 housing a first robot 126 and a second robot buffer chamber 124 housing a second robot 128. In accordance with such an embodiment, each of the first and second robots 126 and 128 may be configured to transfer a wafer/substrate 130 between various process chambers 106A-106I. The main body 104 may further include a pair of intermediate processing or treatment chambers 120A and 120B, which further enable transfer of a wafer/substrate 130 between the first and second robot buffer chambers 122 and 124.

According to one embodiment, the intermediate processing or treatment chamber 120A is located within a tunnel or passageway 132 connecting the first robot buffer chamber 122 to the second robot buffer chamber 124. Similarly, the intermediate processing or treatment chamber 120B is positioned within a separate passageway 134 connecting the first robot buffer chamber 122 to the second robot buffer chamber 124. In accordance with one embodiment, these separate passageways 120A-120B between the two robot buffer chambers 122, 124 permit one passageway to be used for loading and the other passageway for unloading, and vice versa, while the system 100 is being used for wafer processing. According to some embodiments, the intermediate processing or treatment chambers 120A-120B may be configured for pre-treating of a wafer 130 (e.g., remote plasma etch cleaning, heating, etc.) before processing in one or more of the process chambers 106A-106I and/or for post-treating of a wafer 130 (e.g., cool-down) after treatment in one or more of the process chambers 106A-106I.

In accordance with one exemplary embodiment, the platform 102 may utilize a plurality of different process chambers 106A-106I. For example and without limitation, process chambers 106A and 106I may be implemented to perform high temperature degas annealing. In such an embodiment, process chambers 106B and 106H may be implemented as Collins or pre-clean chambers, e.g., PVD chambers. Further, process chambers 106C and 106G may be implemented as silicon-cobalt-nickel (SiCoNi) deposition chambers, whereas process chambers 106D and 106E may be implemented as high bottom coverage (HBC) titanium deposition chambers. In such an embodiment, process chamber 106F may be implemented as a chemical vapor deposition (CVD) titanium nitride (TiN) deposition chamber. The skilled artisan will appreciate that the types of chambers 106A-106I and the processes performed therein (as well as the materials deposited on the wafer 130) may be modified in accordance with the type of semiconductor device being manufactured, and the description above is intended as one possible configuration of the platform 102 in accordance with varying embodiments of the subject application. The functioning of an exemplary process chamber 106A-106I is discussed in detail below with respect to FIGS. 3-4.

The main body 104 further illustrates one or more load lock chambers, designated in FIG. 1 as "Load Lock A" (LLA) 114A and "Load Lock B" (LLB) 114B. In some embodiments, the two load lock chambers 114A and 114B are mounted to the first robot buffer chamber 122 and in communication with the interior of the first robot buffer chamber 122 via access ports 116 and associated gate valves 118 and to an equipment front end module (EFEM) 110 of the platform 102. The EFEM 110 includes a robot 112 that is configured to transfer wafers 130, e.g., one at a time, from a front opening unified pod (FOUP) 108A, 108B, 108C to the load lock chamber 114A or 114B of the main body 104.

As mentioned above, the various process chambers 106A-106I are attached around the first robot buffer chamber 122 and the second robot buffer chamber 124. In FIG. 1, each of the various process chambers 106A-106I may be adapted for various types of processing, e.g., etching, annealing, deposition, cleaning, etc. As shown in FIG. 1, access to and from the process chambers 106-106I may also be accomplished via associated access ports 116 and gate valves 118. Notably, the arrangement of the various chambers and layout of robotic transfer pathways of the system 100 of FIG. 1 is to be understood to be a nonlimiting illustrative example, and other numbers and arrangements of chambers and other robotic transfer pathway layouts are contemplated.

In some embodiments contemplated herein, the platform 102 may be operated such that each process chamber 106A-106I, robot buffer chamber 122-124, intermediate processing or treatment chamber 120A-120B, LLA 114A and LLB 114B may be isolated from each other by gate valves or the like. Accordingly, it will be appreciated that the internal atmosphere in each of these chambers may be independently controlled, both in terms of gas composition and pressure. In some embodiments, variations in pressure levels may be minimized during wafer transfer via an associated vacuum pump or pumps (not shown), which may be configured to provide a vacuum gradient across the system from the load locks LLA 114A and LLB 114B to the process chambers 106A-106I.

Operation of the platform 102 may be controlled by one or more controllers 136, shown in FIG. 1 in data communication with the platform 102 via a communications link 138. The communications link 138 illustrated in FIG. 1 may be any suitable means of wired or wireless communication, including, for example and without limitation, the public switched telephone network, a proprietary communications network, infrared, optical, or other suitable wired or wireless data communications. In some embodiments, the various components of the system 100 are in communication with a distributed computing environment, e.g. a local area network, a wireless local area network, a virtual private network, a wide area network, or the like. In some embodiments, the controller 136 may be configured to control, for example and without limitation, operations of the front end 110 including the operations of the FOUPs 108A, 108B, and 108C, the front end robot 112, operations of the main body 104 including the first and second robots 126-128, the various pumps, gas supplies, valves and treatment equipment of the main body 104, as well as operations of the process chambers 106A-106B. The functioning and controls provided by the controller 136 in accordance with the various embodiments discussed herein will be better understood in conjunction with FIG. 5, discussed in greater detail below.

In some embodiments, processing of a wafer 130 may be initiated by unloading the wafer 130 from one of the FOUPs 108A, 108B, 108C via the front end 110 and placing the wafer 130 in one of the load lock chambers 114A, 114B. Although illustrated in FIG. 1 as utilizing FOUPs for housing wafers 130, it will be appreciated that other mechanisms for supporting wafers 130 may be used in some embodiments, including, for example and without limitation, cassettes, racks, and the like. The skilled artisan will further appreciate that other mechanisms may be used in place of the EFEM 110 to transfer a wafer 130 to the main body 104. After reduction of pressure to a suitable vacuum pressure in the load lock chamber (114A or 114B) containing the wafer 130, the wafer 130 is ready for transfer to an appropriate process chamber or sequence of process chambers for processing. In accordance with one embodiment, the interior pressure of the load lock chamber 114A or 114B containing the wafer 130 to be processed is at substantially the same vacuum pressure as the first robot buffer chamber 122.

Figure 3:
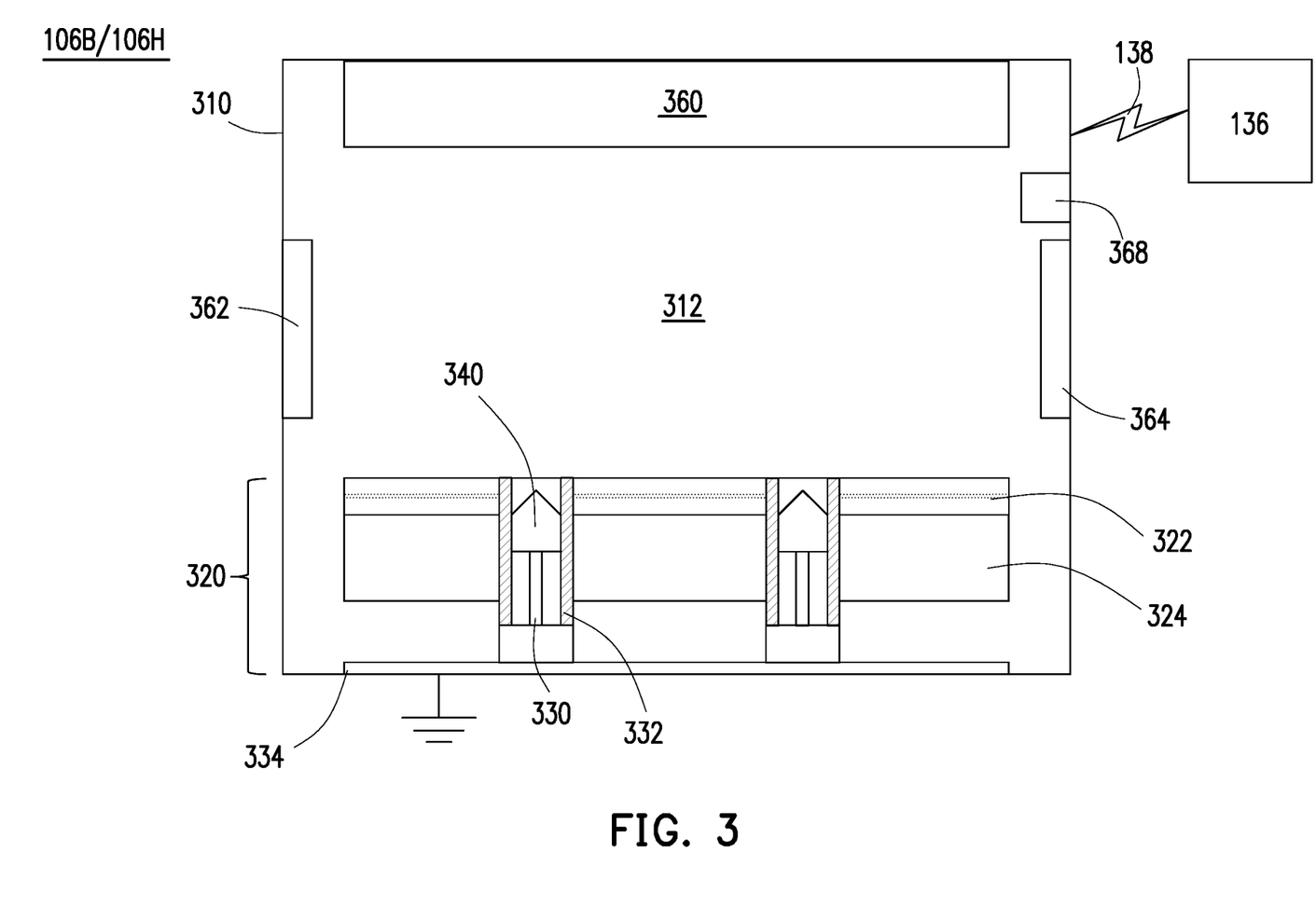
FIG. 3 is a side cross-sectional view showing a pre-clean process chamber in accordance with some embodiments.
Figure 4:
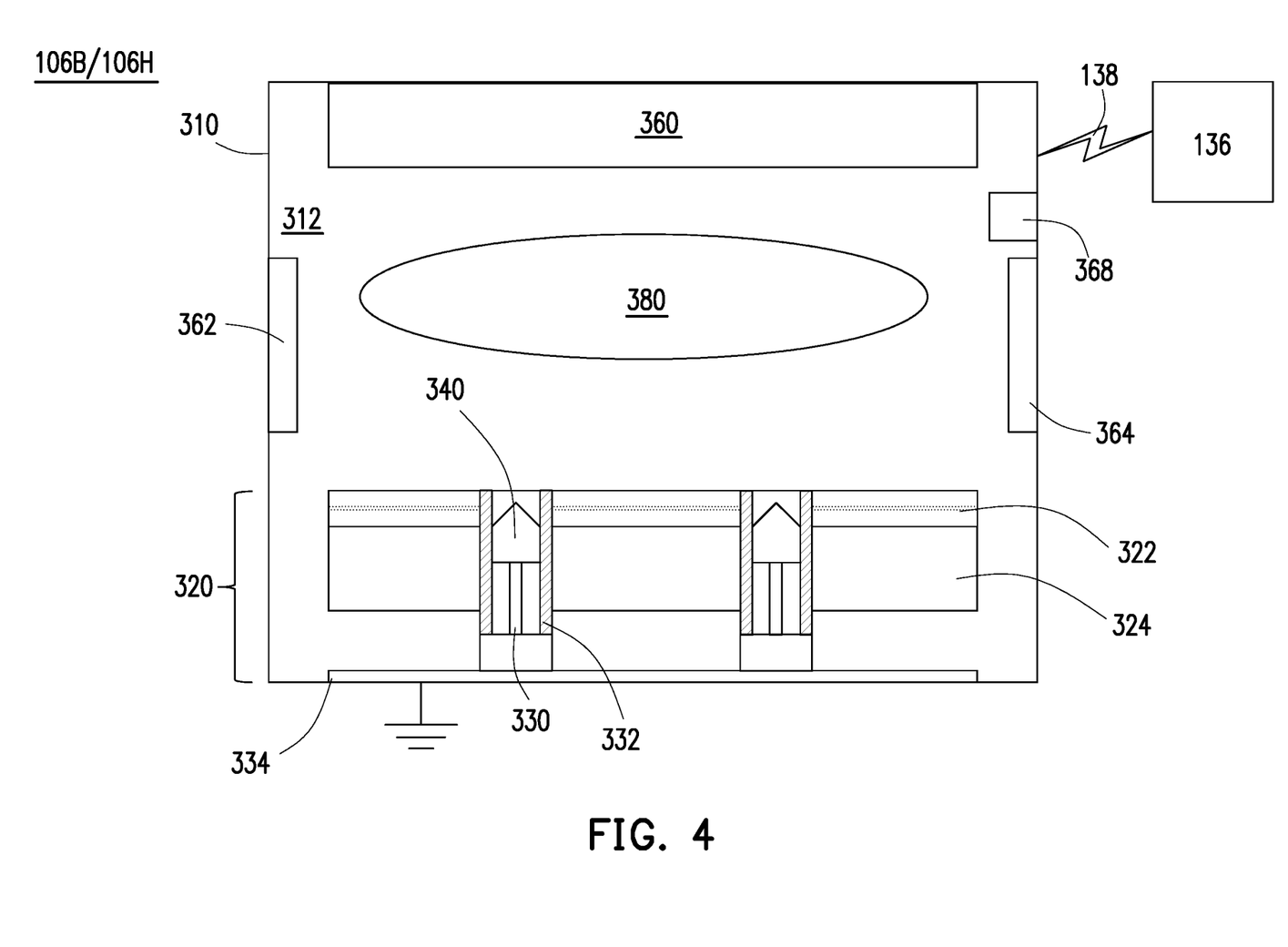
FIG. 4 is a side cross-sectional view showing the pre-clean process chamber of FIG. 2 during chamber cleaning operations in accordance with some embodiments.

Turning now to FIGS. 3-4 there are shown a set of side cross-sectional schematic diagrams illustrating one example process chamber 106A-106I of the present disclosure in which the methods of the present disclosure can be practiced, in accordance with some embodiments, as well as one example method. For example purposes, the process chamber 106A-106I depicted in FIGS. 3-4 is a pre-clean chamber that is used to pre-clean the wafer before it is processed, e.g., by depositing TiSix to form a TiSix/EPI interface, as will be appreciated by those skilled in the art. In some embodiments, the pre-clean chamber, denoted in FIG. 1 as the process chamber 106B or 106H may be implemented as a PVD chamber, i.e., a physical vapor deposition chamber.

As shown in FIG. 3, the pre-clean chamber 106B, 106H includes a housing 310 with an internal volume 312. A wafer support pedestal 320 is present within the housing. The pedestal 320 may be configured to hold a semiconductor wafer substrate in a desired position. For example, the pedestal 320 may apply vacuum to hold the wafer substrate in place by suction. Alternatively, the pedestal 320 may interact mechanically, for example using clamps or retaining rings or the like to hold the wafer substrate in place using a mechanical holding force. An electrostatic holding force might also be used to secure the wafer substrate (e.g., an electrostatic chuck).

The pedestal 320 includes a support surface 322 which contacts (the backside of) the wafer substrate. The support surface 322 itself is usually made of an electrically insulating material. A bottom electrode 324 is located below the support surface 322. Extending through the bottom electrode 324 and the support surface 322 are loading pins 330, which are used to raise and lower the wafer substrate. Each loading pin 330 includes an electrically conductive cushion 340 located at the top of the loading pin 330. In some particular embodiments, the loading pin cushion 340 is made from an electrically conductive silicone. Each loading pin 340 is located within an electrically insulating tube 323, for example made of quartz or other suitable material. Each loading pin 330 is also electrically connected to a loading pin base 334, which goes to ground. The loading pin 330 and loading pin base 334 include electrically conductive materials, such as copper, aluminum, nickel, or other suitable metals.

Continuing, an upper electrode 360 is located above the wafer support pedestal 320. The system also includes one or more gas inlets or nozzles 362, through which process gases are introduced into the internal volume. The gas inlet(s) 362 are connected to gas sources for providing the specified gas. One or more gas outlets 364 is also present for removing undesired gases, and for reducing the pressure within the housing. A gas outlet 364 can be connected to a pump (not shown) for creating vacuum. It will be appreciated that the location of the gas inlet(s) or nozzle(s) 362 and the gas outlet(s) 364 may vary and are illustrated in FIGS. 3-4 on the sides solely as one possible location. In other embodiments, the gas inlet(s) 362 are positioned above the pedestal 320 and the gas outlet 364 is positioned on a bottom of the housing 310. Other locations of the inlet(s) 362 and/or outlet(s) 364 are also contemplated herein. The gas inlet(s) 362 and gas outlet(s) 364 may be located opposing each other, as shown in FIGS. 3-4, e.g., located on different walls of the housing 310. A door or lid (not shown) is also present for accessing the internal volume 312, to insert and remove the wafer substrate.

Figure 5:
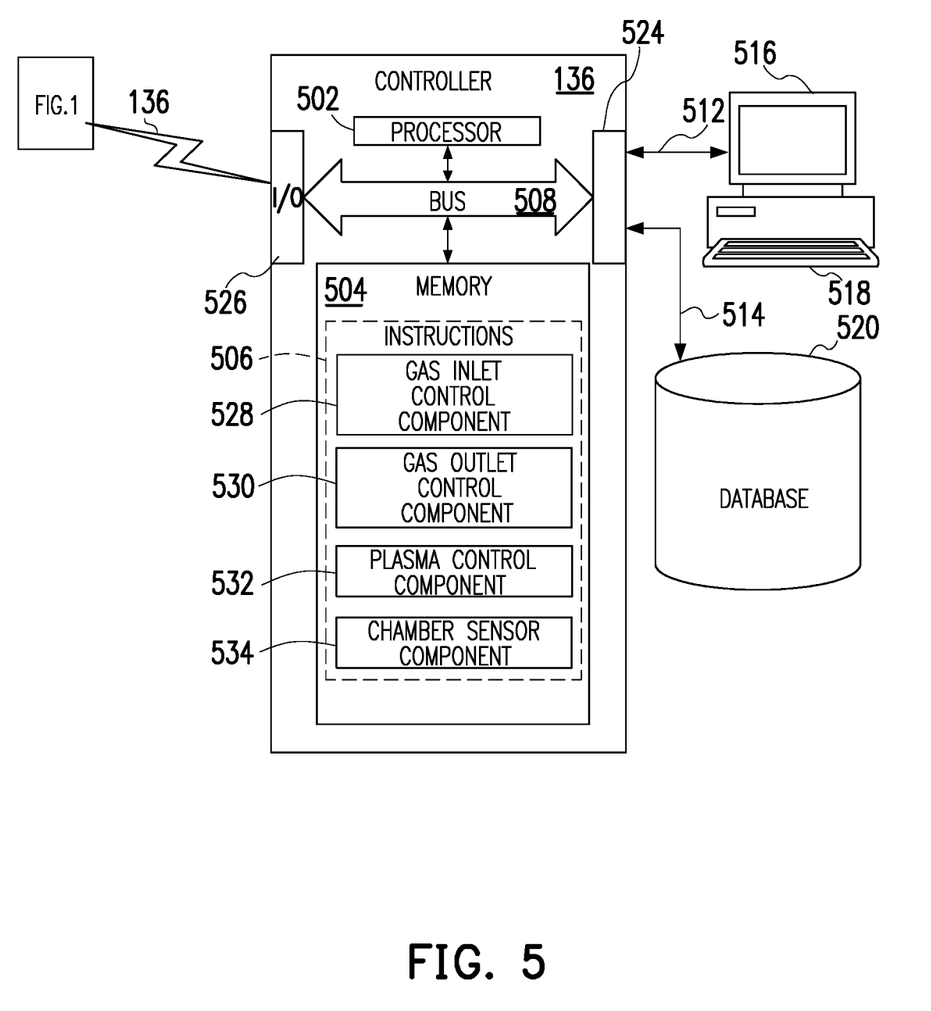
FIG. 5 illustrates a block diagram of a controller in accordance with some embodiments.

In addition, operations of the pre-clean process chamber 106B/106H may be controlled via the controller 136 illustrated in FIG. 1. In some embodiments, the controller 136 is used to control the various inputs and outputs, and to measure various conditions within the housing 310 for the pre-cleaning process. In other embodiments, the pre-clean process chamber 106B/106H may also include sensors 368 for monitoring applicable parameters. For example, such sensors 368 may include, for example and without limitation, those for tracking the flow rate of various gases, for measuring the content of gases exiting the chamber 106B/106H, for measuring the pressure within the chamber 106B/106H, for measuring the temperature of the chamber 106B/106H, for aligning and tracking the movement of wafer support pedestals, and the like. The controller 136 may also be configured to determine whether to activate or deactivate the electrodes 324 and 360, and potentially also control the motion of any automated handling system that may be present (e.g., the various robots 112, 126, 128 as shown in FIG. 1). It is noted that these various parameters may not have to be held steady during operation, and could be changed by the controller 136 operating a computer program which alters their setpoints as appropriate. The controller 136 may also include a user interface for communicating with operators, as illustrated in FIG. 5.

When used for production, the wafer substrate itself can be a wafer made of any semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), indium arsenide (InAs), and indium phosphide (InP). It should also be noted that the integrated circuit (IC) or other electronic device being fabricated may be at some intermediate stage of fabrication. Hence, the wafer may in general have various layers, structures, or so forth deposited or formed on the wafer substrate at the time of the pre-clean processing.

However, in FIG. 3, no wafer is present in the pre-clean process chamber 106B/106H for cleaning of the process chamber 106B/106H between wafer pre-clean processing operations. That is, in accordance with one embodiment, the interior volume 312 of the pre-clean process chamber 106B/106H is cleaned using the methods set forth herein prior to introduction of a wafer for pre-cleaning, after which the wafer is moved to another process chamber for deposition of TiSix. The chamber cleaning using the methods set forth herein operates to improve the TiSix-EPI interface 202 of semiconductor devices 200 during the subsequent TiSix deposition processing.

In FIG. 4, a cleaning process is performed within the interior volume 312 of the pre-clean process chamber 106B/106H. In some embodiments, the cleaning process utilizes a plasma treatment that is performed in a variety of vacuum environments utilizing one or more combinations of process gases, for example with the pressure within the housing 310 being from about 10 millitorrs (mTorr) to about 50 mTorr. The process gas used for generating the plasma may include one or more gases such as nitrogen ($N_2$), hydrogen ($H_2$), oxygen ($O_2$), or argon (Ar) that enter through the gas inlet 362. In one embodiment, a combination of $O_2$/Ar, $O_2$/Ar, and Ar is used during the cleaning process, as discussed in greater detail below. Voltage is applied between the upper electrode 360 and the lower electrode 324, creating a plasma 380. The power used to generate the plasma may range from about 10 watts (W) to about 2,000 W. In some embodiments, the divider capacitor (DivCap) settings may range from about 10% to 95%. It will be appreciated that the DivCap may be adjusted to control plasma distribution in the chamber 106B/106H.

Turning now to FIG. 5, there is shown an illustrative block diagram of a suitable controller 136 associated with the platform 102 in accordance with one embodiment of the subject application. The various components of the controller 136 may be connected by a data/control bus 508. The processor 502 of the controller 136 is in communication with an associated database 520 via a link 514. A suitable communications link 514 may include, for example, a switched telephone network, a wireless radio communications network, infrared, optical, or other suitable wired or wireless data communications. The database 520 is capable of implementation on components of the controller 136, e.g., stored in local memory 504, i.e., on hard drives, virtual drives, or the like, or on remote memory accessible to the controller 136.

The associated database 520 is representative of any organized collections of data (e.g., process tool information, fabrication information, material information, etc.) used for one or more purposes. The skilled artisan will appreciate that such information may be updated via machine learning during operations of the subject system 100. Implementation of the associated database 520 is capable of occurring on any mass storage device(s), for example, magnetic storage drives, a hard disk drive, optical storage devices, flash memory devices, or a suitable combination thereof. The associated database 520 may be implemented as a component of the controller 136, e.g., resident in memory 504, or the like. In one embodiment, the associated database 520 may include data corresponding to production scheduling, wafer positioning, process chamber information (e.g. type, position, status, etc.), and the like.

The controller 136 may include one or more input/output (I/O) interface devices 524 and 526 for communicating with external devices. The I/O interface 524 may communicate, via communications link 512, with one or more of a display device 516, for displaying information, such estimated destinations, and a user input device 518, such as a keyboard or touch or writable screen, for inputting text, and/or a cursor control device, such as mouse, trackball, or the like, for communicating user input information and command selections to the processor 502. The I/O interface 522 may communicate with external devices such as the process chambers 106A-106I, the robots 112, 126, 128, the load lock chambers 114A, 114B, the EFEM 110, the access ports 116, the gate valves 118, intermediate processing or treatment chambers 120A-120B, via the communications link 138.

It will be appreciated that the controller 136 illustrated in FIG. 5 is capable of implementation using a distributed computing environment, such as a computer network, which is representative of any distributed communications system capable of enabling the exchange of data between two or more electronic devices. It will be further appreciated that such a computer network includes, for example and without limitation, a virtual local area network, a wide area network, a personal area network, a local area network, the Internet, an intranet, or any suitable combination thereof. Accordingly, such a computer network comprises physical layers and transport layers, as illustrated by various conventional data transport mechanisms, such as, for example and without limitation, Token-Ring, Ethernet, or other wireless or wirebased data communication mechanisms. Furthermore, while depicted in FIG. 5 as a networked set of components, the controller 136 is capable of implementation on a stand-alone device adapted to interact with the system 100 described herein.

The controller 136 may include one or more of a computer server, workstation, personal computer, cellular telephone, tablet computer, pager, combination thereof, or other computing device capable of executing instructions for performing the exemplary method.

According to one example embodiment, the controller 136 includes hardware, software, and/or any suitable combination thereof, configured to interact with an associated user, a networked device, networked storage, remote devices, or the like.

The memory 504 illustrated in FIG. 5 as a component of the controller 136 may represent any type of non-transitory computer readable medium such as random access memory (RAM), read only memory (ROM), magnetic disk or tape, optical disk, flash memory, or holographic memory. In one embodiment, the memory 504 comprises a combination of random access memory and read only memory. In some embodiments, the processor 502 and memory 504 may be combined in a single chip. The network interface(s) 524, 526 allow the computer to communicate with other devices via a computer network, and may comprise a modulator/demodulator (MODEM). Memory 504 may store data processed in the method as well as the instructions for performing the exemplary method.

The digital processor 502 can be variously embodied, such as by a single core processor, a dual core processor (or more generally by a multiple core processor), a digital processor and cooperating math coprocessor, a digital controller, or the like. The digital processor 502, in addition to controlling the operation of the controller 108, executes instructions 506 stored in memory 504 for performing the method set forth hereinafter.

As shown in FIG. 5, the instructions 506 stored in memory 504 may include a. gas inlet control component 528 configured to activate and control a flow of gas into a process chamber 106A-106I. In some embodiments, the inlet control component 528 may be configured to control a servo motor or other actuator (not shown) associated with the gas inlet 362. In other embodiments, the inlet control component 362 may be configured to adjust a throttle valve associated with the gas inlet 362, whereby internal pressure of the process chamber 106A-106I may be maintained, adjusted, and the like.

The memory 504 of the controller 136 may further store a gas outlet control component 530 in the instructions 506 configured to control operations of the gas outlet 364 of a process chamber 106A-106I. In some embodiments, the outlet control component 530 may be configured to control a servo motor or other actuator (not shown) associated with the gas outlet 364. In other embodiments, the outlet control component 364 may be configured to adjust a throttle valve associated with the gas outlet 364, whereby internal pressure of the process chamber 106A-106I may be maintained, adjusted, and the like. The gas outlet control component 530 may be further configured to direct operations of the gas outlet 364 during purging operations of the process chamber 106A-106I.

The memory 504 further stores instructions 506 that include a plasma control component 532 operable to control generation of plasma 380 within a process chamber 106A-106I. That is, in some embodiments, the plasma control component 532 may be configured to control operations of the electrodes 360 and 324 to generate the aforementioned plasma 380. In additional embodiments, the plasma control component 532 may be configured to control operations of a power supply (not shown) for plasma generation.

The instructions 506 stored in memory 504 further include a chamber sensor component 534 configured to receive sensor data output by one or more sensors 368 associated with a chamber 106A-106I. As indicated above, the data received from the one or more sensors 368 may include, for example and without limitation, pressure data, gas flow data, temperature data, position data, and the like. In accordance with varying embodiments contemplated herein, the sensor data may be utilized by the controller 136 to regulate the flow of gas via the inlet(s) 362 and/or outlets 364 for the chamber 106A-106I, the temperature within the chamber 106A-106I, and the like.

The term "software," as used herein, is intended to encompass any collection or set of instructions executable by a computer or other digital system so as to configure the computer or other digital system to perform the task that is the intent of the software. The term "software" as used herein is intended to encompass such instructions stored in storage medium such as RAM, a hard disk, optical disk, or so forth, and is also intended to encompass so-called "firmware" that is software stored on a ROM or so forth. Such software may be organized in various ways, and may include software components organized as libraries, Internet-based programs stored on a remote server or so forth, source code, interpretive code, object code, directly executable code, and so forth. It is contemplated that the software may invoke system-level code or calls to other software residing on a server or other location to perform certain functions. Operations of the controller 136 will be better understood in conjunction with the exemplary methods set forth in FIG. 6.

Figure 6:
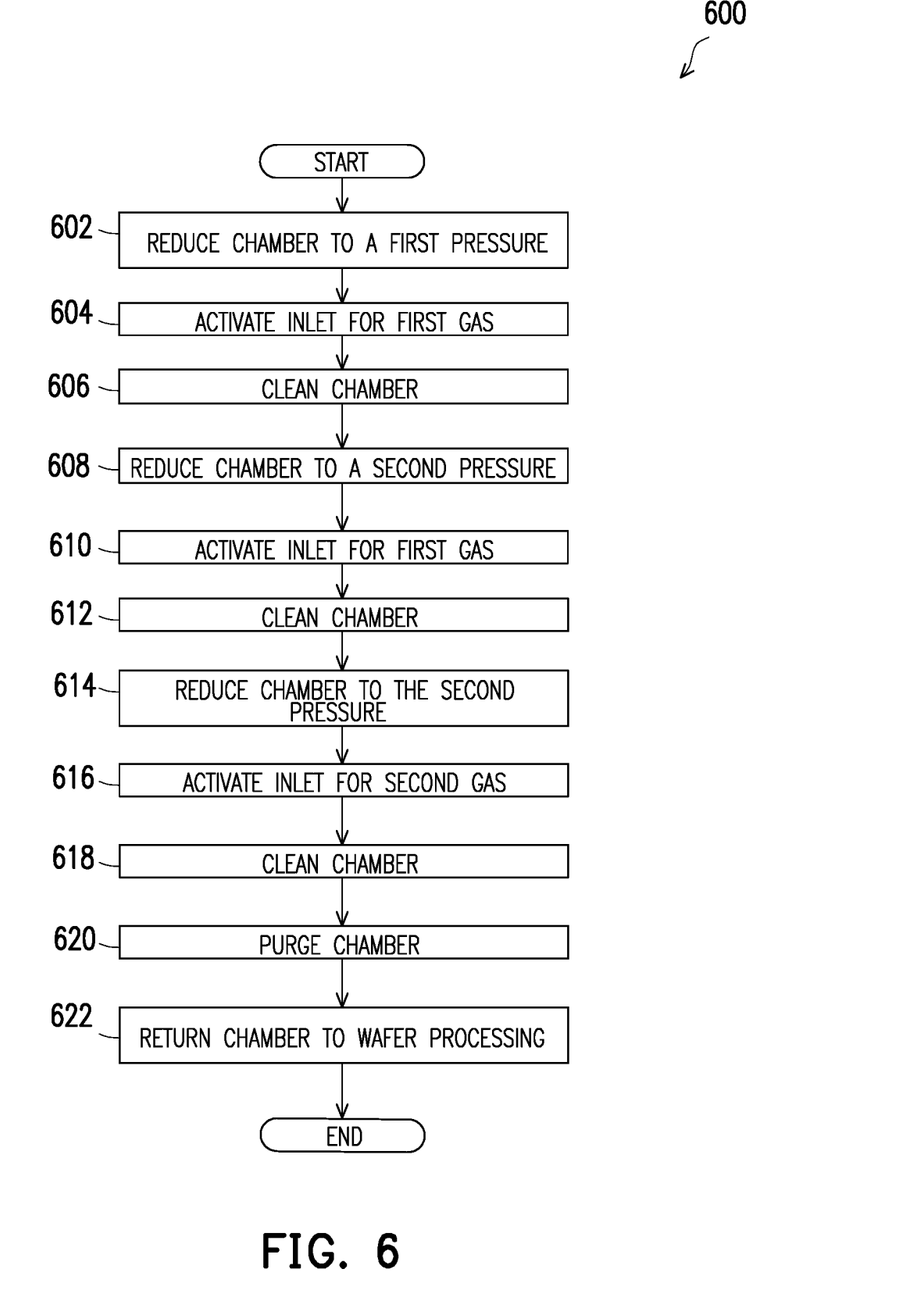
FIG. 6 is a flowchart illustrating a chamber cleaning method for improving the TiSix-EPI interface in accordance with some embodiments.

FIG. 6 is a flowchart illustrating a chamber cleaning method 600 for improving the TiSix-EPI interface 202 of a semiconductor device 200 in accordance with some embodiments. The method 600 for cleaning the preclean process chamber 106B/106H begins at 602, whereupon the pressure of the chamber 106B/106H is reduced from a relatively high pressure, for example an elevated pressure due to opening a gate valve to the buffer chamber 122 to withdraw the last processed wafer, to a first vacuum pressure. In some embodiments, the internal pressure of the chamber 106B/106H is reduced to a range of 40 to 70 mTorr and in some exemplary embodiments, approximately 50 mTorr. At 604, the controller 136 or other suitable component associated with the system 100 activates the gas inlet 362 to allow a first gas to enter the chamber 106B/106H. In some embodiments, the pressure within the chamber 106B/106H is maintained via adjustment of the inlet 362 and/or outlet 364 at the first pressure. In accordance with one embodiment, the first gas comprises a mixture of oxygen and an inert gas. In other embodiments, the first gas comprises oxygen and a noble gas. Further, some embodiments disclosed herein utilize a first gas comprising a mixture of oxygen and argon. In some embodiments, the ratio of oxygen to argon may range from 0-5, including, for example and without limitation, a ratio of 3.5/1 $O_2$/Ar. More generally, it may correspond to a mixture of oxygen and another inert gas, such as another noble gas. At 606, the chamber 106B/106H is cleaned a first time. That is, at 606, plasma 380 is generated within the chamber 106B/106H using the first gas, as will be appreciated by those skilled in the art. In one embodiment, the power used to generate the plasma 380 may range from about 500 W to about 2000 W, and in some embodiments, 1250 W may be used. Plasma control distribution may be obtained via a DivCap setting in the range from about 15% to about 90%. In some embodiments, this cleaning step 606 and first vacuum pressure are maintained for a predetermined period of time. For example and without limitation, the cleaning step 606, i.e. plasma generation, may continue for 15 to 30 seconds, and in some exemplary embodiments range from 18-26s at 50 mTorr.

Operations then proceed to step 608, whereupon the internal pressure of the chamber 106B/106H is reduced to a second vacuum pressure which is lower than the first vacuum pressure. In some embodiments, the internal pressure of the chamber 106B/106H is reduced to a range of about 5 mTorr to 15 mTorr and in some exemplary embodiments, approximately 10 mTorr. At step 610, the controller 136 or other suitable component associated with the system 100 activates the gas inlet 362 to allow the first gas to enter the chamber 106B/106H again. In some embodiments, the pressure within the chamber 106B/106H is maintained via adjustment of the inlet 362 and/or outlet 364 at the second vacuum pressure. At step 612, the chamber 106B/106H is cleaned for a second time using the first gas. That is, at step 612, plasma 380 is generated within the chamber 106B/106H using the first gas, as will be appreciated by those skilled in the art. In one embodiment, the power used to generate the plasma 380 may range from about 500 W to about 2000 W, and in some embodiments, 1250 W may be used. Plasma control distribution may be obtained via a DivCap setting in the range from about 15% to about 90%. In some embodiments, this cleaning step 612 and second vacuum pressure are maintained for a predetermined period of time. For example and without limitation, the cleaning step 612, i.e. plasma generation, may continue for 25 to 45 seconds, and in some exemplary embodiments range from 30-40s at 10 mTorr.

After completion of step 612, operations proceed to step 614, whereupon the internal pressure of the chamber 106B/106H is reduced to the second pressure. At 616, the controller 136 or other suitable component associated with the system 100 activates the gas inlet 362 to allow a second gas to enter the chamber 106B/106H. In one embodiment, the second gas comprises an inert gas devoid or deficient of oxygen. In other embodiments, the second gas comprises an oxygen-free noble gas. According to one embodiment, the second gas is argon (rather than an oxygen/argon mixture). In some embodiments, the pressure within the chamber 106B/106H is maintained via adjustment of the inlet 362 and/or outlet 364 at the second vacuum pressure. At step 618, the chamber 106B/106H is cleaned a third time. That is, at step 612, plasma 380 is generated within the chamber 106B/106H using the second gas, as will be appreciated by those skilled in the art. In one embodiment, the power used to generate the plasma 380 may range from about 500 W to about 2000 W, and in some embodiments, 1250 W may be used. Plasma control distribution may be obtained via a DivCap setting in the range from about 15% to about 90%. In some embodiments, this cleaning step 618 and second vacuum pressure are maintained fora predetermined period of time. For example and without limitation, the cleaning step 618, i.e. plasma generation, may continue for 15 to 30 seconds, and in some exemplary embodiments range from 18-26s at 10 mTorr.

The chamber 106B/106H is then purged at step 620. That is, at step 620 the controller 136 or other component associated with the system 100 activates a suitable pump (not shown) and gas outlet 364 to purge (i.e. empty) the chamber 106B/106H of any residual materials. Thereafter, at step 622, the chamber 106B/106H is returned to wafer processing, whereupon a wafer 130 may be input into the chamber 106B/106H for precleaning of the wafer 130, as discussed above. In some embodiments, the internal pressure of the chamber 106B/106H may be subsequently raised to enable transfer of the wafer 130 into the chamber 106B/106H for precleaning processing.

Advantageously, the reactive oxygen of the oxygen/argon mixture (or, more generally, oxygen/inert gas mixture) in cleaning steps 606 and 612 provides for cleaning of organics and other contaminants in the chamber that react with the oxygen. This is optionally aided by forming a plasma from the first gas, which breaks the molecular $O_2$ into highly reactive oxygen species. However, while the steps 606 and 612 advantageously employ oxygen for effective chamber cleaning, it is recognized herein that the oxygen admitted to the chamber in steps 606 and 612 can leave residual oxygen in the chamber 106B/106H after completion of the step 612 and the subsequent chamber purge 620, which can then contaminate the EPI surface of the subsequently loaded wafer that is to undergo pre-cleaning. That EPI surface contamination, in turn, can lead to a degraded TiSix/EPI interface between the EPI and the subsequently deposited TiSix. As disclosed herein, this deleterious effect of the oxygen is mitigated by interposing the third chamber cleaning step 618 between the second chamber cleaning step 612 employing the first gas containing oxygen (e.g., the illustrative oxygen/argon mixture, or more generally a mixture of oxygen and an inert gas such as a noble gas) and the final purge 620. Because the second gas used in the interposed third cleaning step 618 is an inert gas, such as argon, that does not contain oxygen, it operates to remove the residual oxygen from cleaning steps 606 and 612 from the chamber.

Figure 7A:
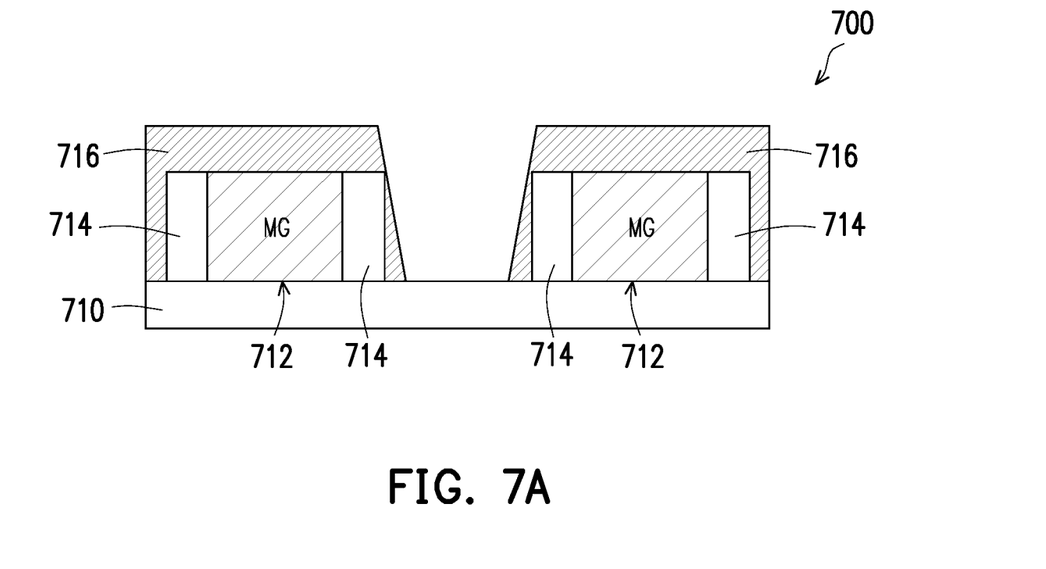
FIGS. 7A-7E illustrate cross-sectional views of some steps for forming an improved TiSix-EPI interface, in accordance with some embodiments.

In accordance with one exemplary embodiment, the chamber cleaning process 600 set forth in the flowchart of FIG. 6 reduces impurities that may form at the TiSix-EPI interface 202. After the process chamber 106B/106H undergoes the above described cleaning method 600, a wafer 130 may be inserted therein for precleaning, as will be appreciated by those skilled in the art. After wafer pre-clean processing in the preclean chamber 106B/106H, the wafer 130 may be transported via the robot 124 to the SiCoNi chamber 106C/106G for processing, whereupon the precleaning process of the wafer 130 is completed. FIGS. 7A-7E illustrate a method of forming a semiconductor device with improved TiSix-EPI interface 202 in accordance with the cleaning process 600 of FIG. 6. That is, after the preclean chamber 106B/106H has undergone the above-described cleaning process of FIG. 6, a wafer 130 is subjected to a precleaning process performed by the preclean chamber 106B/106H. The method begins in FIG. 7A, which provides an illustrative side profile view of the wafer 130 subsequent to the aforementioned precleaning operation. As shown in FIG. 7A, the wafer 130 includes one or more Metal-to-Gate ("MG") components 712 formed on a substrate 710, e.g., a poly-, Si, or other suitable semiconductor material. In some embodiments, the MG components 712 may be implemented as TAN or other conductive material, as will be appreciated by the skilled artisan. Adjacent the MG components 712 are capacitive components 714. In some embodiments, the capacitive components 714 may be implemented as SiN materials, providing capacitance between the MG components 714 and the EPI surface. A dielectric component 716 covers MG components 712 and capacitive components 714, as illustrated in FIG. 7A. According to some embodiments, the dielectric component 716 may be implemented as, for example and without limitation, a silicon-oxide (SiO2) material or other suitable dielectric material. It will be appreciated that the aforementioned chamber cleaning process removes the Co bottom oxide, minimizes EPI damage, and SiN loss with critical damage control denoted generally at 700.

Thereafter, the wafer is transported to chambers 106A/106I for high temperature degas annealing (HT degas ANL). In some embodiments, the degas chamber 106A/106I may utilize an internal temperature of greater than 200° C., e.g., 400° C. per degas cycle. Accordingly, the degas cycle may range from 30 to 90 seconds in duration, and in some embodiments the cycle may be greater than 60 seconds. Further, the number of HT degas ANL cycles may vary, and in some embodiments range from 1 to 5 cycles, and generally 3 or more cycles are performed on the wafer 130 prior to subsequent processing.

Figure 7B:
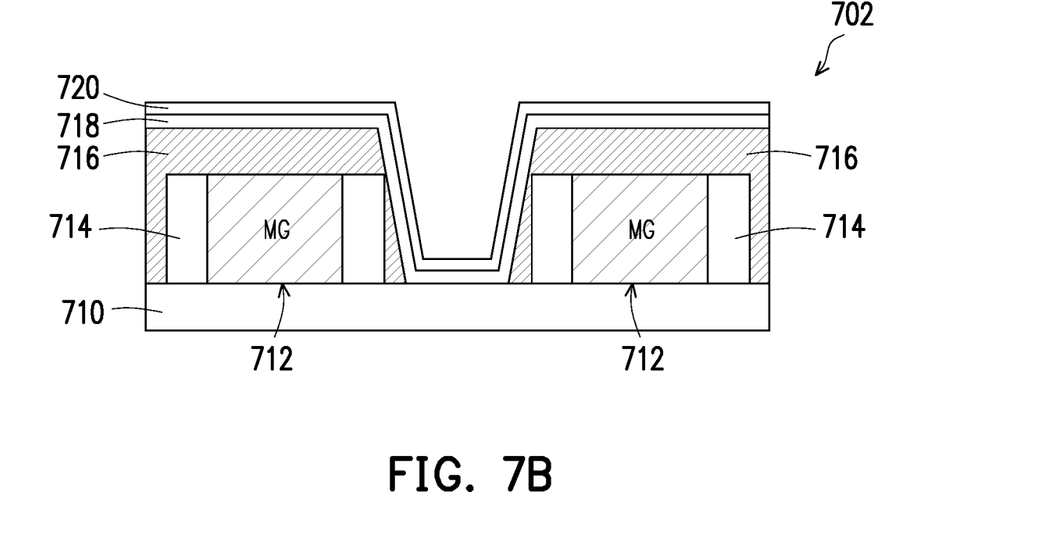

Next, the wafer 130 may proceed to HBC chamber 106D/106E for high bottom coverage (HBC) processing, e.g., HBC-Ti (silicide material), then to CVD chamber 106F for CVD deposition, e.g., CVD TiN deposition to form a metal capping layer and a barrier layer. FIG. 7B provides an illustrative side view of the wafer 130 after the HBC and CVD processing denoted generally at 702. As shown in FIG. 7B, the wafer 130 now includes a silicide component 718 and a barrier layer component 720. In some embodiments, the silicide component 718 may be implemented as a Ti deposited material, although other silicide materials may also be used as will be appreciated. The barrier layer 720 may be implemented as, for example and without limitation a TiN material, or the like, providing a barrier between the silicide component 718 and the subsequent deposition of Co material, as illustrated below in FIG. 7D.

Figure 7C:
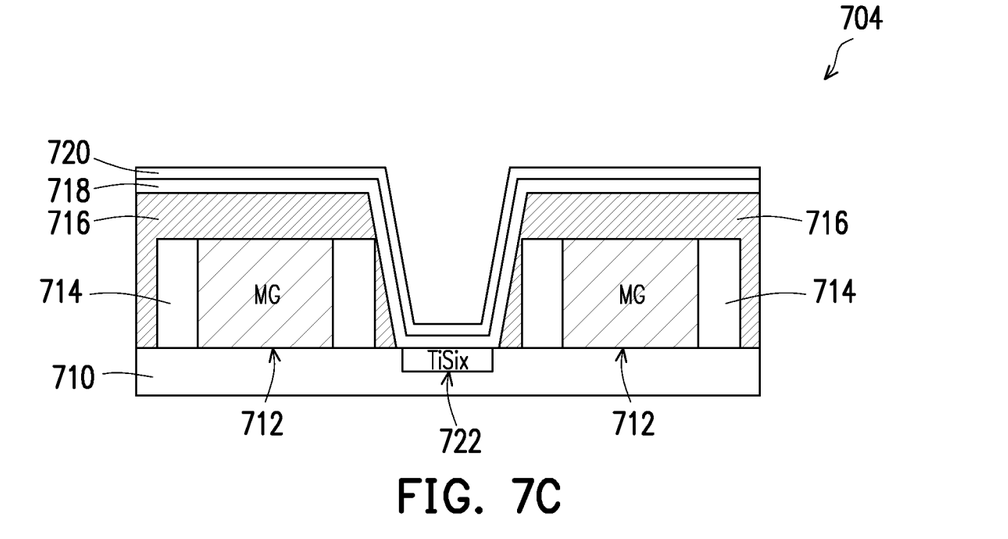

Thereafter, rapid thermal annealing (RTA) may be performed to form the silicide interface, e.g., the EPI and metal (i.e. TiSix) interconnect 722, referred to as the EPI-TiSix interface 722. Such annealing may utilize temperatures in excess of 500° C., and in some instances at or above 575° C. FIG. 7C provides an illustrative side view of the wafer 130 subsequent to the RTA processing, denoted generally at 704. As shown in FIG. 7C, the TiSix interface 722 is formed from the previously deposited Ti and the Si from the EPI (SiGe composition) during the RTA. It will be appreciated that threshold voltage (Vt) is affected by the thickness of the TiSix, providing thermal budget control.

Figure 7D:
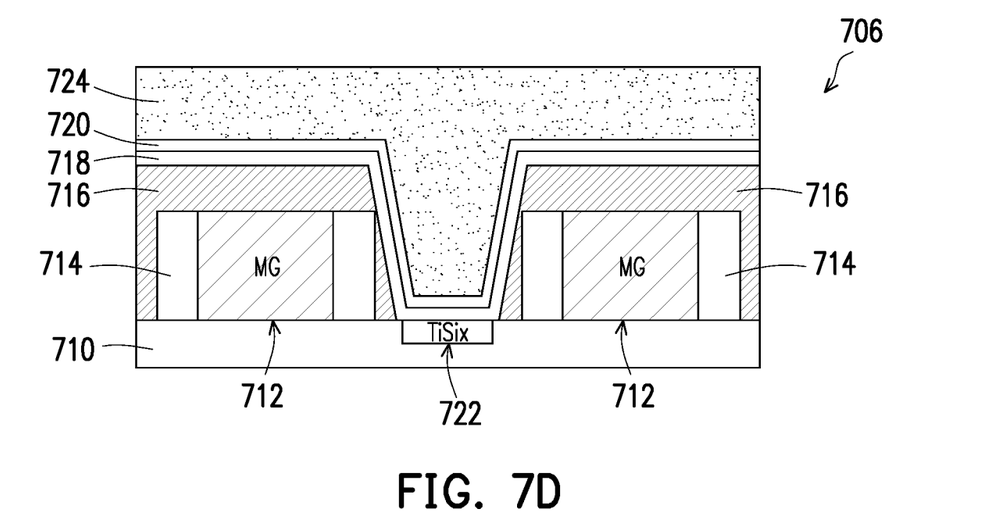
Figure 7E:
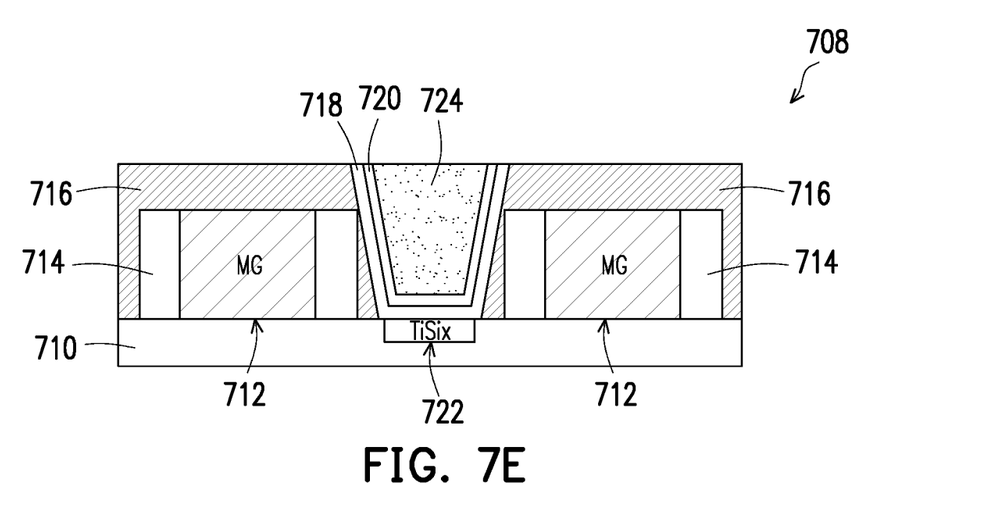

Next, TiN-PB is performed and a Co plug deposition occurs 706, as shown in FIG. 7D. That is, a Co plug 724 is deposited on the wafer 130 as illustrated in FIG. 7D. In some embodiments, the Co plug 724 may function as a wire material, e.g., conductive connectors for other components (not shown). Thereafter, the wafer 130 is transported to suitable chemical mechanical planarization (polishing) (CMP) device (not shown) for planarization 708, resulting in the semiconductor product depicted in FIG. 7E. In some embodiments, the CMP device may be attached to the system 100, or located remotely from the system 100, i.e., external to the platform 102.

In the illustrative embodiments, the chamber cleaning process 600 is performed on the pre-cleaning chamber prior to its use in pre-cleaning a wafer prior to subsequent TiSix deposition, as described. The chamber cleaning 600 improves the resultant TiSix/EPI interface by reducing residual oxygen contamination, notably by removing residual oxygen left in the pre-cleaning chamber after steps 606 and 612 of the chamber cleaning process by the oxygen-free cleaning step 618. More generally, however, it is contemplated to employ the chamber cleaning process 600 for cleaning of other types of process chambers in which mitigation of residual oxygen from the chamber cleaning may be beneficial.

Figure 8A:
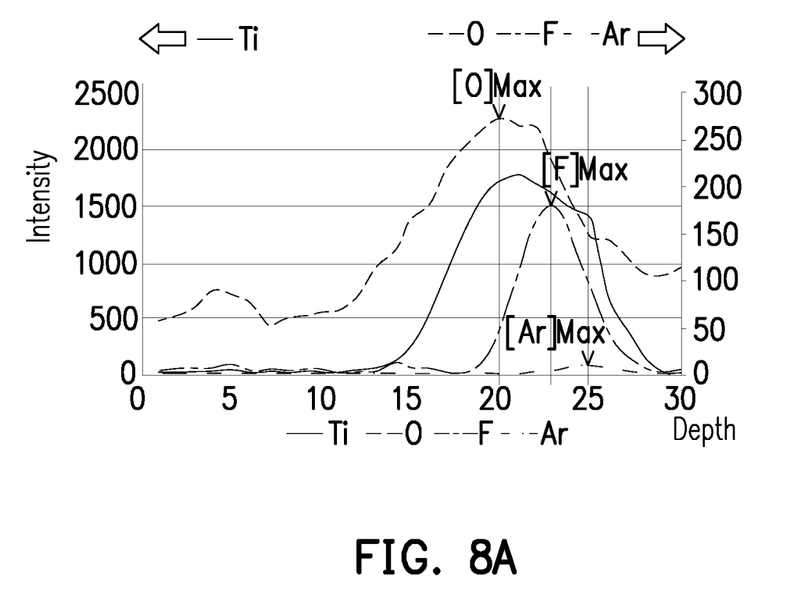
FIGS. 8A-8B, provide a comparative illustration of the resulting TiSix-EPI interface composition with and without the chamber cleaning process of FIG. 6 in accordance with one embodiment.
Figure 8B:
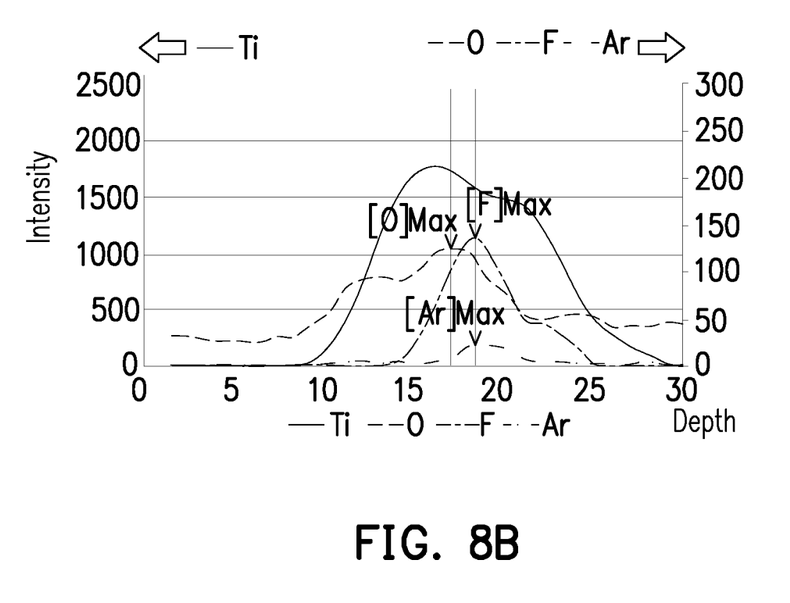

FIGS. 8A and 8B provide a comparative illustration TiSix-EPI interface composition without the cleaning process 600 (FIG. 8A) and with the use of the cleaning process 600 in between wafer operations (FIG. 8B) provides an illustration of wafer operations without use of intervening cleaning process. As shown in FIGS. 8A and 8B, the amounts of oxygen and fluorine at the TiSix-EPI interface 202 have been substantially reduced relative to the amount of titanium in the interface. In the example illustration of FIG. 8B using the above-identified method, the resulting TiSix-EPI interface 202 has improved, resulting in ratios (with respect to titanium) of: $[O]_{max}/[Ti]<0.4$; $[Ar]_{max}/[Ti]>0.01$; $[F]_{max}/[Ti]<0.3$. In contrast, FIG. 8A illustrates that the ratios of oxygen and fluorine to titanium are substantially higher in the interface, leading to possible impurities and other defects.

In accordance with a first embodiment, there is provide a method for cleaning a process chamber for improved TiSix-EPI interface. The method includes the step of reducing a pressure inside the process chamber to a first pressure, and cleaning the process chamber using a first gas of oxygen and an inert gas at the first pressure. The method further includes the steps of reducing the pressure inside of the process chamber to a second pressure, and cleaning the process chamber using the first gas at the second pressure. The method also includes the steps of cleaning the process chamber using a second gas that comprises the inert gas devoice of oxygen at the second pressure, and then purging the process chamber.

In accordance with a second embodiment, there is provided a method for manufacturing a semiconductor device having an improved TiSix-EPI interface. The method includes the step of cleaning a first process chamber using a first gas comprising oxygen and a noble gas and a second gas comprising an oxygen-free noble gas, and precleaning a wafer in the first process chamber subsequent to the cleaning. The method further includes degassing the wafer in a second process chamber at a preselected temperature, and performing a high bottom coverage process on the wafer in a third process chamber. The method also includes performing chemical vapor deposition on the wafer in a fourth process chamber, and performing rapid thermal annealing on the wafer in a fifth process chamber.

In accordance with a third embodiment, there is provided a system for fabricating a semiconductor device having an improved TiSix-EPI interface. The system includes a platform having a preclean process chamber and a controller. The controller is in communication with the platform and the preclean process chamber, the controller comprising a processor in communication with memory storing instructions which are executed by the processor to reduce a pressure inside the preclean process chamber to a first pressure. The memory further stores instructions to activate an inlet to introduce a first gas comprising oxygen and an inert gas into the preclean process chamber, and to generate plasma in the preclean process chamber using the first gas at the first pressure. The memory also stores instructions to reduce the pressure inside of the preclean process chamber to a second pressure, and to generate plasma in the preclean process chamber using the first gas at the second pressure. In addition, the memory further stores instructions to activate the inlet to introduce a second gas comprising the inert gas devoid of oxygen into the preclean process chamber, and generate plasma in the preclean process chamber using the second gas at the second pressure. Furthermore, the memory includes instructions that are executed by the processor to purge the preclean process chamber.

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cleaning a process chamber for improved TiSix-EPI interface, comprising:
   reducing a pressure inside the process chamber to a first pressure;
   cleaning the process chamber using a first gas comprising oxygen and an inert gas at the first pressure;
   reducing the pressure inside of the process chamber to a second pressure;
   cleaning the process chamber using the first gas at the second pressure;
   cleaning the process chamber using a second gas comprising the inert gas devoid of oxygen at the second pressure; and
   purging the process chamber.

2. The method of claim 1, wherein:
   the cleaning of the process chamber using the first gas at the first pressure includes generating a plasma from the first gas;
   the cleaning of the process chamber using the first gas at the second pressure includes generating a plasma from the first gas; and
   the cleaning of the process chamber using the second gas at the second pressure includes generating a plasma from the second gas.

3. The method of claim 1, wherein the process chamber is a pre-clean process chamber.

4. The method of claim 1, wherein the first gas comprises a mixture of oxygen and a noble gas.

5. The method of claim 1, further comprising activating a gas inlet to introduce the first gas into the process chamber prior to cleaning the process chamber at the first pressure and the second pressure.

6. The method of claim 1, further comprising activating a gas inlet to introduce the second gas into the process chamber prior to cleaning the process chamber at the second pressure using the second gas.

7. The method of claim 1, wherein the step of purging further comprises activating a gas outlet to remove at least one of the first or second gas.

8. The method of claim 1, wherein the first pressure is a stable pressure at a range from 40 to 70 m Torr.

9. The method of claim 1, wherein the second pressure is a stable pressure at a range from 5 m Torr to 15 mTorr.

10. The method of claim 1, further comprising:
   precleaning a wafer in the process chamber subsequent to the cleaning;
   degassing the wafer in a second process chamber at a preselected temperature;
   performing a high bottom coverage process on the wafer in a third process chamber;
   performing chemical vapor deposition on the wafer in a fourth process chamber; and
   performing rapid thermal annealing on the wafer in a fifth process chamber.

11. The method of claim 4, wherein the noble gas is argon.

12. A method for cleaning a process chamber for improved TiSix-EPI interface, comprising:
   reducing a pressure inside the process chamber to a first pressure of 40 to 70 mTorr;
   cleaning the process chamber using a first gas comprising oxygen and an inert gas at the first pressure;
   reducing the pressure inside of the process chamber to a second pressure of 5 to 15 mTorr;
   cleaning the process chamber using the first gas at the second pressure;
   removing the first gas from the process chamber;
   introducing a second gas comprising the inert gas devoid of oxygen into the process chamber;
   cleaning the process chamber using the second gas at the second pressure; and
   purging the process chamber.

13. The method of claim 12, wherein the inert gas is a noble gas.

14. The method of claim 12, wherein the first gas is a mixture of oxygen and a argon, and wherein the second gas is an argon gas.

15. The method of claim 12, wherein the cleaning of the process chamber using the first gas at the first pressure includes generating a plasma from the first gas.

16. The method of claim 12, wherein the first process chamber is a physical vapor deposition chamber.

17. A method for cleaning a preclean process chamber, comprising:
   reducing a pressure inside the preclean process chamber to a first pressure;
   activating an inlet to introduce a first gas comprising oxygen and an inert gas into the preclean process chamber;
   generating plasma in the preclean process chamber using the first gas at the first pressure;
   reducing the pressure inside of the preclean process chamber to a second pressure;
   generating plasma in the preclean process chamber using the first gas at the second pressure;
   activating the inlet to introduce a second gas comprising the inert gas devoid of oxygen into the preclean process chamber;
   generating plasma in the preclean process chamber using the second gas at the second pressure; and
   purging the preclean process chamber.

18. The method of claim 17, wherein the first gas is a mixture of oxygen and argon, and wherein the second gas is an argon gas.

19. The method of claim 17, wherein the first pressure is greater than the second pressure.

20. The method of claim 17, wherein the preclean process chamber is configured to preclean a wafer disposed therein, and the method further comprises:
   precleaning the wafer in the preclean process chamber subsequent to the purge;
   degassing the wafer in a high temperature degas annealing process chamber at a preselected temperature;
   performing high bottom coverage on the wafer in a high bottom coverage process chamber;
   performing chemical vapor deposition on the wafer in a chemical vapor deposition process chamber; and
   performing rapid thermal annealing on the wafer in the high temperature degas annealing process chamber.

* * * * *